United States Patent

Batchelder

[11] Patent Number: 5,885,661
[45] Date of Patent: Mar. 23, 1999

[54] DROPLET JET METHOD FOR COATING FLAT SUBSTRATES WITH RESIST OR SIMILAR MATERIALS

[75] Inventor: William T. Batchelder, San Mateo, Calif.

[73] Assignee: Semiconductor Systems, Inc., Fremont, Calif.

[21] Appl. No.: 507,797

[22] Filed: Jul. 26, 1995

Related U.S. Application Data

[63] Continuation of Ser. No. 158,259, Nov. 24, 1993, abandoned.

[51] Int. Cl.$^6$ ............................... B05D 1/02; B05B 5/025
[52] U.S. Cl. .............................. 427/425; 427/240; 239/3; 239/4; 239/102.2
[58] Field of Search ..................................... 427/240, 425; 346/75, 140 R; 118/50.1, 314, 315; 239/3, 4, 102.2

[56] References Cited

U.S. PATENT DOCUMENTS

| | | | |
|---|---|---|---|
| 4,267,212 | 5/1981 | Sakawaki | 427/240 |
| 4,580,148 | 4/1986 | Domoto et al. | 346/140 R |
| 4,696,885 | 9/1987 | Vijan | 430/311 |
| 4,938,994 | 7/1990 | Choinski | 427/96 |
| 4,963,882 | 10/1990 | Hickman | 346/1.1 |
| 4,992,808 | 2/1991 | Bartky et al. | 346/140 R |
| 5,229,171 | 7/1993 | Donovan et al. | 427/483 |

*Primary Examiner*—Shrive Beck
*Assistant Examiner*—David M. Maiorana
*Attorney, Agent, or Firm*—Skjerven, Morrill, MacPherson, Franklin & Friel; David E. Steuber

[57] ABSTRACT

An apparatus and method are provided for efficiently and effectively coating a substantially flat surface, i.e., a substrate, with a high-viscosity chemical such as photoresist. The chemical is dispensed through a piezo electrically controlled droplet jet cartridge on to the surface. The thickness of the chemical coating is controlled by controlling the rate at which chemical is dispensed through the droplet jet cartridge. A number of droplet jet cartridges are aligned such that gaps in chemical dispensed by one droplet jet cartridge are filled by chemical dispensed by other droplet jet cartridges. An array of droplet jet cartridges which spans the width of the surface moves across the surface to coat the surface with chemical in a single pass. To coat a circular surface, the surface is spun while a droplet jet cartridge is moved from the center of the surface to the outer edge of the surface. Chemical is dispensed on to the surface in a helical pattern.

4 Claims, 4 Drawing Sheets

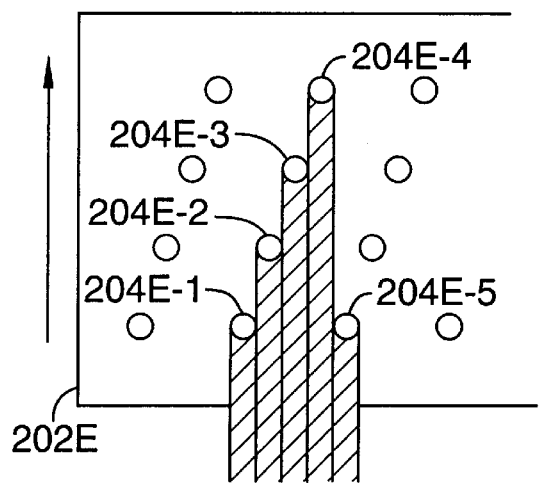
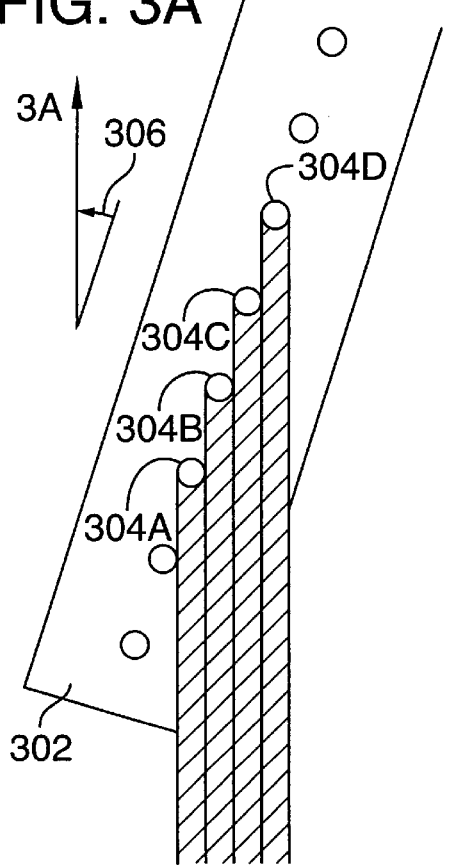
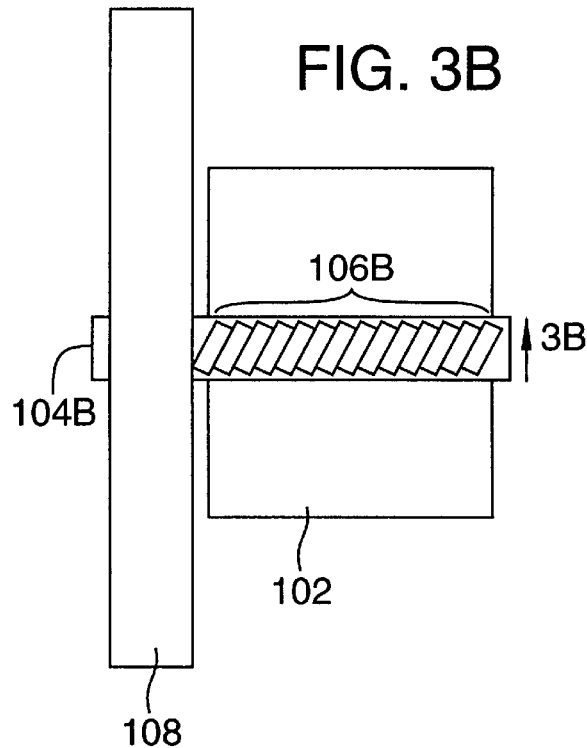

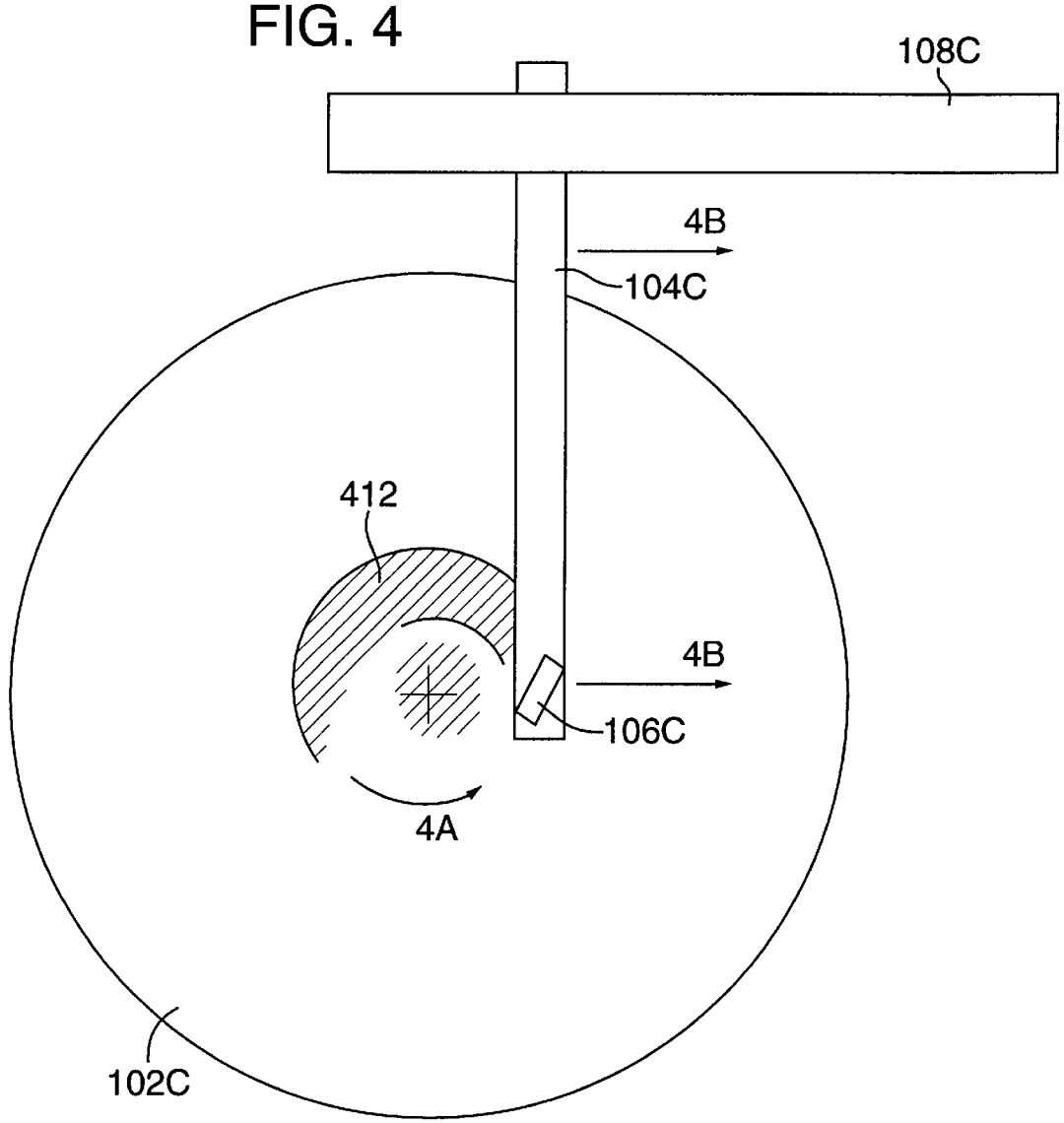

DROPLET JET METHOD FOR COATING FLAT SUBSTRATES WITH RESIST OR SIMILAR MATERIALS

This application is a continuation of application Ser. No. 08/158,259, filed Nov. 24, 1993, now abandoned.

BACKGROUND OF THE INVENTION

1. Field of the Invention

The present invention relates to thin-film coatings of flat substrates such as semiconductor wafers and flat panel displays, and in particular to application of photoresist and similar high-viscosity chemicals with minimized chemical waste and improved coating uniformity.

2. Description of the Related Art

In the fabrication of semiconductors, a wafer is coated with photoresist or a similar high-viscosity liquid chemical by any of a number of methods. (As used herein, the term "liquid" is not limited to fluids of low-viscosity and, in fact, can refer to highly viscous chemical substances.) These methods include dry film thermal application, spin coating, roller coating, meniscus coating, slot coating, spray coating, and silk screening. The most successful and popular of these methods is spin coating, in which photoresist is applied to the wafer and the wafer is spun to completely coat the wafer. The rate of rotation of the wafer is then increased, or "ramped up", to spin off excess photoresist to provide a coating of a desired thickness.

Until recently, spin coating has been mostly confined to coating circular surfaces or small square mask plates. However, spin coating is now used to apply chemicals to thin film heads, multi-chip modules, and flat panel displays which are square or rectangular and are often very large. Spin coating such surfaces presents primarily two problems.

First, the corners of a square or rectangular surface are poorly covered. The chemical being applied to the surface is spun to the edge where excess is thrown from the surface by centrifugal force. Chemical leaving the center of an edge is struck by the corner of the spinning surface as the corner is further from the center of the surface than is the center of an edge. Such a collision disrupts the even flow of chemical from the center of the surface to the corners of the surface.

Secondly, spin coating larger surfaces results in striations in the chemical coating toward the edges and corners of the surface as a result of uneven drying of the chemical. To cover a large surface before the chemical dries, the chemical is applied to a surface spinning at a normal speed and the speed of the spinning surface is then ramped up, i.e., gradually increased, as the chemical spreads. Increasing the spin rate spreads the chemical more quickly and potentially before the chemical thickens substantially.

The surface tension of the chemical on the spinning surface is what causes the chemical to spread evenly during spinning. However, as the spinning rate is increased, the centrifugal force overcomes the surface tension of the chemical. This is especially true on larger surfaces such as large flat panel displays or when small volumes of chemical are used. When the surface tension is overcome, the smooth circular shape of the spreading chemical bursts like a bubble and the chemical then streams linearly toward the edges of the spinning surface in multiple radial paths. These multiple radial paths contribute to the formation of striations in the coating of the spinning surface.

The radial gaps in coating, i.e., the gaps between the radial streams of chemical, are filled in by applying an excess of the chemical to the center of the spinning surface. Excess chemical is applied until radial flow of the chemical from the center of the surface, as a result of the extreme centrifugal force, fills in the uncoated area. Thus, the surface is coated by saturating the surface with chemical, most of which, i.e., 95% or more, is discarded as waste. Furthermore, the uniformity of the coating can be poor as a result of uneven coating when the surface is initially coated and uneven drying of the chemical coating.

Excessive use of photoresist in particular is a significant problem in the art. Photoresist accounts for approximately 5% of the cost of materials for semiconductors and generally costs as much as $1,000 or more per gallon. Much of the photoresist used to coat a wafer is wasted. For example, a 1 micron thick coating of photoresist with a 20% solids content on a 200 mm silicon wafer should require 0.16 cc of photoresist. However, to spin coat a 200 mm wafer typically uses 4 cc to 5 cc of photoresist; 97% of the photoresist is wasted. Thus, excessive waste of photoresist significantly affects the cost of manufacturing semiconductor devices. Lesser volumes are typically not used because, with lesser volumes, the photoresist dries prematurely and the uniformity of the coating is adversely effected.

Additionally, disposal of photoresist waste presents a substantial environmental burden on communities in which semiconductor devices are manufactured and on surrounding ecological systems. The problem of excess photoresist is exacerbated when coating larger surfaces.

What is needed is a method and apparatus which efficiently and effectively coats a substantially flat surface with a chemical. A method and apparatus capable of efficiency and effectively coating large, rectangular, flat surfaces with chemical is also desirable.

SUMMARY OF THE DISCLOSURE

Photoresist is dispensed directly on to the substrate using piezo electrically controlled droplet jet cartridges. As photoresist is dispensed on to the substrate to a desired thickness, the substrate is only spun to smooth any anomalies in the coating of the substrate. Since photoresist is dispensed directly on to the corners of a rectangular substrate, problems associated with coating corners of rectangular substrates are avoided. Furthermore, as the entire substrate, including the outer edges, is coated directly using droplet jet cartridges and not by spinning the substrate, no striations in the coating are formed as a result of spinning the substrate. Additionally, the waste of photoresist associated with spin coating techniques of the prior art is avoided by dispensing directly on to the entire substrate a desired thickness of photoresist.

A number of droplet jet cartridges are aligned such that gaps in photoresist dispensed by one droplet jet cartridge are filled by photoresist dispensed by other droplet jet cartridges. An array of droplet jet cartridges which spans the width of the substrate moves across the substrate to coat the substrate with photoresist in a single pass. To coat a circular substrate, the substrate is spun while a droplet jet cartridge is moved from the center of the substrate to the outer edge of the substrate. Photoresist is dispensed on to the substrate in a helical pattern.

BRIEF DESCRIPTION OF THE DRAWINGS

FIG. 2D shows a portion of a mask plate formed in accordance with the principles of another aspect of the present invention.

FIGS. 3A and 3B illustrate another embodiment of the present invention.

FIG. 4 illustrates the coating of a circular substrate in accordance with the principles of the present invention.

DETAILED DESCRIPTION OF PREFERRED EMBODIMENTS

An apparatus and method are provided for effectively and efficiently coating a substantially flat substrate with a liquid chemical such as photoresist. While photoresist is described herein as the liquid chemical with which a substrate is coated, the principles described herein and recited in the claims below are equally applicable to coating substantially flat substrates with any other chemical. Furthermore, although large flat panels for flat panel displays are described as an illustrative example of a substantially flat substrate, any substrate, including thin-film heads, semiconductor wafers, and multi-chip modules, may be coated according to the principles set out below.

Figure 1A:
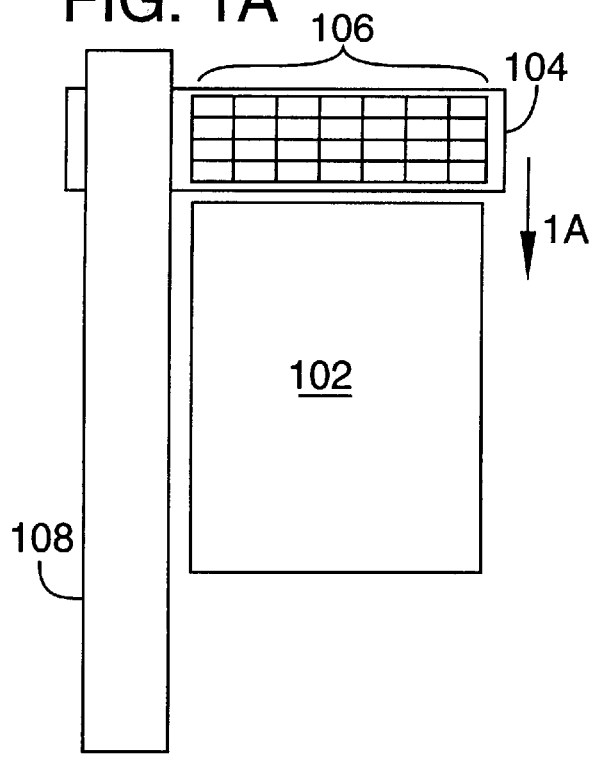
FIGS. 1A and 1B are plan views of one embodiment of the present invention.

A large, flat panel 102 (FIG. 1A) is coated with a photoresist chemical (not shown) by dispensing photoresist through a droplet jet array 106 as droplet jet array 106 is moved across the surface of flat panel 102. Droplet jet array 106 is an array of piezo electrically driven droplet jet cartridges such as the OTT part number 2128 droplet jet cartridge used in ink jet printers available from On Target Technology of Santa Clara, Calif. The individual droplet jet cartridges of droplet jet array 106 are aligned such that movement of droplet jet array 106 in the direction of arrow 1A while dispensing photoresist over flat panel 102 dispenses contiguous lines of photoresist. The contiguous lines of photoresist collectively form a coating of photoresist on the top surface of flat panel 102.

Droplet jet array 106 is mounted on a linear dispense arm 104 which moves linearly along a linear track 108. Linear dispense arm 104 and linear track 108 can be a linear dispense arm and a linear track, respectively, commonly used and known in the art. For example, the linear dispense arm and linear track used in the Apex Flat Panel Coater available from Semiconductor Systems, Inc. of Fremont, Calif. can be used as linear dispense arm 104 and linear track 108, respectively.

Figure 2A:
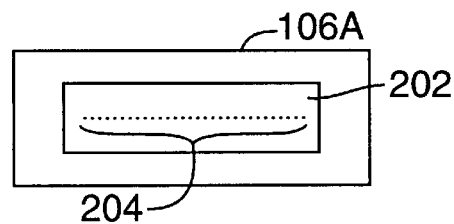
FIG. 2A shows the underside of a droplet jet cartridge according to the principles of the present invention.
Figure 2B:
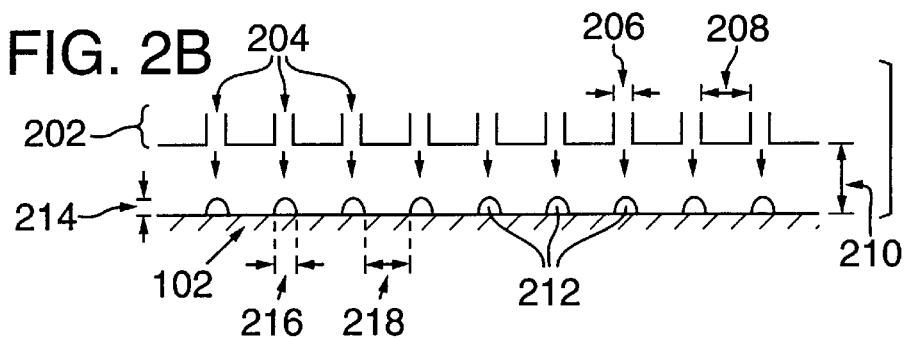
FIG. 2B illustrates the application of photoresist to a flat panel through a droplet jet cartridge.

The underside of a droplet jet cartridge 106A (FIG. 2A) of droplet jet array 106 has a mask plate 202 through which a number of ports 204 pass. In one embodiment, thirty-two (32) ports 204 pass through mask plate 202. Ports 204 (FIG. 2B) have a diameter 206 of approximately 10 mils and are spaced a distance 208 of approximately twenty-two (22) mils apart. Thus, ports 204 are spread over an length of approximately one inch.

Mask plate 202, when positioned over flat panel 102 at a distance 210 of approximately forty (40) mils or one (1) mm, dispenses droplets at a rate of approximately 5,000 droplets of photoresist per second. As mask plate 202 moves across flat panel 102 as a result of the movement of linear dispense arm 104 (FIG. 1A) across flat panel 102, droplets 212 of photoresist form lines of photoresist having a height 214 and a width 216 and are spaced a distance 218 apart. Height 214 is approximately 2.5 microns; width 216 is approximately ten (10) mils; and distance 218 is approximately twenty-two (22) mils. In a preferred embodiment, the photoresist has a viscosity of approximately twenty (20) centipoise. Since droplets are dispensed at a rate of approximately 5,000 droplets per second, the lines of photoresist are dispensed at a rate of approximately fifty (50) inches per second.

Figure 2C:
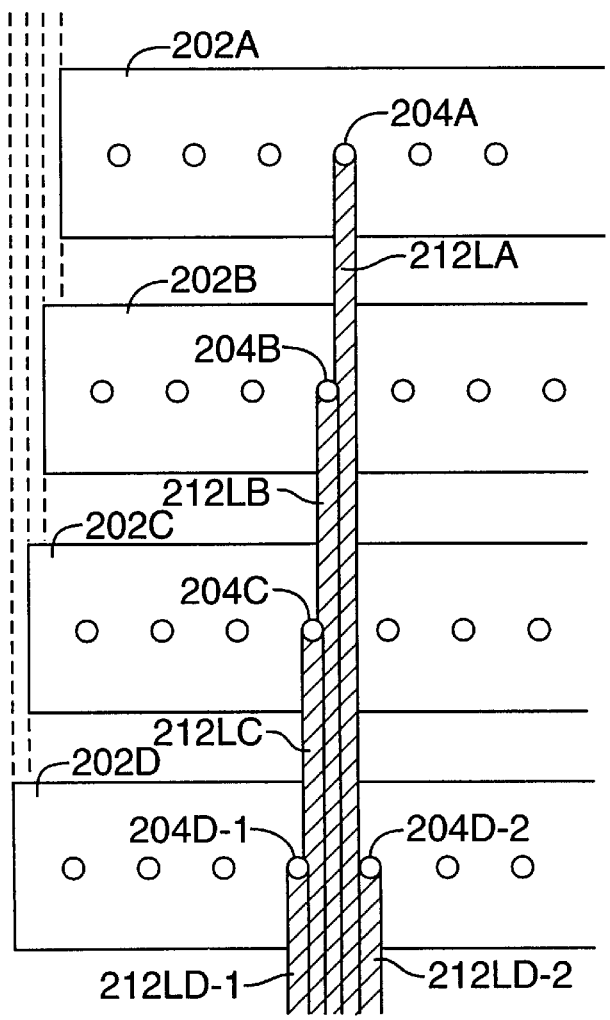
FIG. 2C illustrates the alignment of a number of droplet jet cartridges in accordance with one aspect of the present invention.

To coat the area of flat panel 102 between the lines of photoresist, a number of droplet jet cartridges are aligned as shown (FIG. 2C). For example, lines of photoresist 212LD-1 and 212LD-2, which are dispensed from ports 204D-1 and 204D-2, respectively, of mask plate 202D, leave a gap therebetween. That gap is filled by lines of photoresist 212LC, 212LB, and 212LA, which are dispensed from ports 204C, 204B, and 204A, respectively, of mask plates 202C, 202B, and 202A, respectively. Mask plates 202A–202D combine to dispense a strip of photoresist which is approximately one (1) inch in width.

Droplet jet array 106 (FIG. 1A) includes, in one embodiment, four rows of droplet jet cartridges which are positioned relative to one another as shown in FIG. 2C to dispense photoresist across the entire width of flat panel 102. Flat panel 102 is thereby coated with a coating of photoresist chemical of a thickness of approximately 2.5 microns. Since the width of each of lines of photoresist 212LA–212LC (FIG. 2C) is ten (10) mils and the gap between lines of photoresist is twenty-two (22) mils, there is some overlap between the lines of photoresist. The height of the photoresist coating will therefore be greater than 2.5 microns in some places, in particular at points at which lines of photoresist overlap.

Figure 1B:
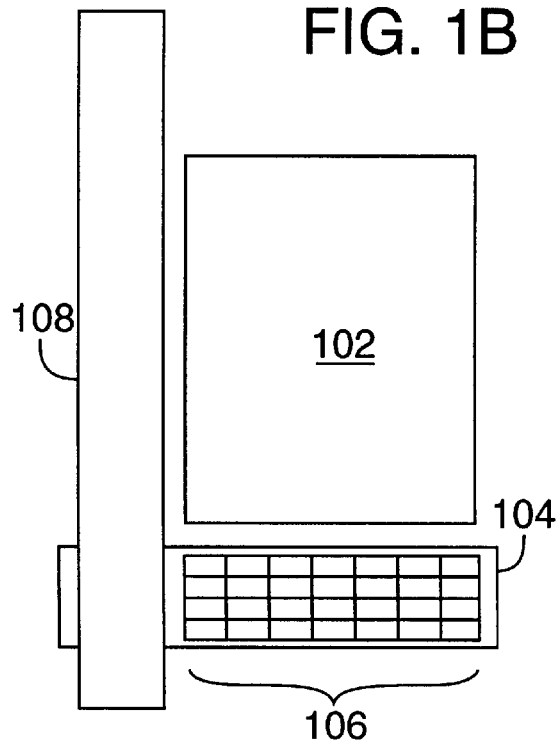

In addition to the overlapping of lines of photoresist, individual droplets of photoresist dispensed by an individual droplet jet cartridge can vary as much as fifteen percent in volume from droplets dispensed by other cartridges. Additionally, the average volume of a single droplet dispensed by each individual port can vary as much as fifteen percent from the average volume of droplets dispensed by other ports of the same cartridge. Thus, the coating initially dispensed by droplet jet array 106 (FIG. 1B) can be of a non-uniform thickness. Therefore, once flat panel 102 is coated, flat panel 102 can be spun as is done in the prior art to smooth the coating of photoresist and to assure proper thickness of the photoresist coating. However, if the coating has a substantially uniform thickness, spinning flat panel 102 is not necessary.

Each row of droplet jet cartridges of droplet jet array 106 (FIG. 1A) is controlled to dispense photoresist only when positioned over flat panel 102. Thus, the problem of photoresist edge bead, which generally requires backside cleaning at the edge of a semiconductor wafer, is generally avoided.

Mask plate 202E (FIG. 2D) has four rows of ports which are positioned so as to leave no gaps or overlap between lines of photoresist dispensed through mask plate 202E. For example, ports 204E-2, 204E-3 and 204E-4 are spaced so as to exactly fill the gap between ports 204E-1 and 204E-5. Mask plate 202E can be used in place of mask plates 202A–202D (FIG. 2C) to produced a one inch wide strip of photoresist on flat panel 102 with no significant overlap between lines of photoresist.

In another embodiment, rather than being oriented perpendicular to the direction of movement over flat panel 102, which is represent by arrow 3A (FIG. 3A), a droplet jet cartridge is oriented relative to the direction of movement by an angle 306. The orientation of the droplet jet cartridge, which includes mask plate 302, aligns ports 204A–204D such that no gap is left between ports 204A–204D as shown.

Droplet jet array 106B (FIG. 3B) includes a single row of droplet jet cartridges which are oriented as shown in FIG. 3A. The individual droplet jet cartridges of droplet jet array 106B are positioned relative to one another so as to dispense a contiguous sheet of photoresist over flat panel 102 as linear dispense arm 104B moves along linear track 108 in the direction of arrow 3B.

Circular substrates such as a semiconductor wafer 102C (FIG. 4) can be quickly and efficiently coated with photoresist 412 or other similar chemical according to the principles of the present disclosure. Wafer 102C is coated as follows. Wafer 102C is rotated in the direction of arrow 4A. Photoresist is dispensed through droplet jet cartridge 106C which is as described above with respect to FIGS. 3A and 3B. Droplet jet cartridges described above with respect to FIGS. 2A–2D are also suitable for use as droplet jet cartridge 106C. If droplet jet cartridges described above with respect to FIGS. 2A–2C are used, droplet jet cartridge 106C is four separate droplet jet cartridges positioned as shown in and described above with respect to FIG. 2C.

Linear dispense arm 104C is moved along linear track 108C from the center of wafer 102C in the direction of arrows 4B to the outer edge of wafer 102C. During this movement, photoresist is dispensed through droplet jet cartridge 106C to dispense photoresist 412 on to wafer 102C in a helical pattern. Alternatively, linear dispense arm 104C is held in a fixed position to dispense photoresist 412 on to wafer 102C in a circular pattern. Linear dispense arm 104C is then moved along linear track 108C and then held in a second fixed position to dispense photoresist 412 on to wafer 102C in a second circular pattern. The dispensing of photoresist 412 and movement of linear dispense arm 104C along linear track 108C are repeated so as to coat wafer 102C with contiguous concentric circles of photoresist 412.

Since a shorter linear distance of the top surface of wafer 102C passes under ports nearer the center of wafer 102C than under ports nearer the outside edge of wafer 102C, photoresist 412 dispensed under ports nearer the center wafer 102C is generally thicker than photoresist 412 dispensed under ports nearer the outside edge of wafer 102C. To compensate, control of individual ports of droplet jet cartridge 106C is needed to adjust the dispense rate of each port. The OTT part number 2128 droplet jet cartridge available from On Target Technology of Santa Clara, Calif. provides such control of individual ports. Alternatively, wafer 102C is spun following dispensing of photoresist 412 to smooth the coating of photoresist 412 to a uniform, desired thickness.

While specific embodiments are disclosed herein, the disclosed embodiments are illustrative only and are not to be limiting of the present invention. The present invention is therefore limited only by the claims which follow.

What is claimed is:

1. A method for coating a substrate with photoresist, the method comprising:

rotating the substrate about a center of rotation;

moving a droplet jet cartridge having an array of ports over the substrate along a line extending between the center of rotation of the substrate and an edge of the substrate; and dispensing photoresist through the cartridge on to the rotating substrate, wherein a line of photoresist deposited by a first one of the ports is at least contiguous to a line of photoresist deposited by a second one of the ports, the width of the lines of photoresist being substantially equal to the respective diameters of the ports.

2. The method of claim 1 wherein the cartridge comprises a piezo electrically driven droplet jet.

3. The method of claim 1 wherein the substrate is rotated and the cartridge is moved so as to deposit the photoresist in a helical path on the substrate.

4. A method for coating a substrate with photoresist, the method comprising:

rotating the substrate about a center of rotation;

moving a droplet jet cartridge to a first position located at a first radial distance from said center of rotation;

holding the cartridge stationary in said first position while dispensing photoresist through said cartridge so as to deposit said photoresist in a first circular path on the substrate;

terminating the dispensing of photoresist through said cartridge;

moving the cartridge to a second position located at a second radial distance from said center of rotation; and holding the cartridge stationary in said second position while dispensing photoresist through said cartridge so as to deposit said photoresist in a second circular path on the substrate.

\* \* \* \* \*